United States Patent
Spampinato (10) Patent No.: US 6,979,883 B2
(45) Date of Patent: Dec. 27, 2005

(54) INTEGRATED DEVICE IN EMITTER-SWITCHING CONFIGURATION AND RELATED MANUFACTURING PROCESS

(75) Inventor: Sergio Tommaso Spampinato, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 110 days.

(21) Appl. No.: 10/032,289

(22) Filed: Dec. 21, 2001

(65) Prior Publication Data

US 2002/0109151 A1    Aug. 15, 2002

(30) Foreign Application Priority Data

Dec. 28, 2000   (IT) .......................... 2000A002836

(51) Int. Cl.[7] ................... H01L 27/082; H01L 27/102; H01L 29/70; H01L 31/11
(52) U.S. Cl. .................. 257/570; 257/362; 361/56
(58) Field of Search .............. 257/150, 133, 257/145, 195, 205, 273, 337, 350, 361, 362, 257/363, 370, 378, 499, 594, 566, 567; 438/205, 438/328; 361/54

(56) References Cited

U.S. PATENT DOCUMENTS

| | | | | |
|---|---|---|---|---|
| 4,994,880 A | * | 2/1991 | Kato et al. ................. | 257/579 |
| 5,665,994 A | * | 9/1997 | Palara ......................... | 257/378 |
| 6,127,723 A | * | 10/2000 | Aiello et al. ................ | 257/582 |
| 6,207,481 B1 | * | 3/2001 | Yi et al. ..................... | 438/166 |
| 6,218,709 B1 | * | 4/2001 | Yasuda ....................... | 257/378 |
| 6,614,633 B1 | * | 9/2003 | Kohno .......................... | 361/56 |

* cited by examiner

Primary Examiner—B. William Baumeister
Assistant Examiner—Dana Farahani
(74) Attorney, Agent, or Firm—Lisa K. Jorgenson; Robert Iannucci; Seed IP Law Group PLLC (57) ABSTRACT

An integrated device in emitter-switching configuration is described. The device is integrated in a chip of semiconductor material of a first conductivity type which has a first surface and a second surface opposite to each other. The device comprises a first transistor having a base region, an emitter region and a collector region, a second transistor having a not drivable terminal for collecting charges which is connected with the emitter terminal of the first transistor, a quenching element of the first transistor which discharges current therefrom when the second transistor is turned off. The quenching element comprises at least one Zener diode made in polysilicon which is coupled with the base terminal of the first transistor and with the other not drivable terminal of the second transistor. The at least one polysilicon Zener diode is formed on the second surface of said chip and it comprises a polysilicon layer having at least one zone of the first conductivity type and at least one zone of a second conductivity type in order to form at least one P-N junction.

30 Claims, 8 Drawing Sheets

INTEGRATED DEVICE IN EMITTER-SWITCHING CONFIGURATION AND RELATED MANUFACTURING PROCESS

BACKGROUND OF THE INVENTION

1. Field of the Invention

The present invention refers to an integrated device in emitter-switching configuration and related manufacturing process.

2. Description of the Related Art

Among the different integrated devices in emitter-switching configuration there is a particular type that is constituted by a high voltage power bipolar transistor and by a low voltage signal transistor where the emitter terminal of the power transistor is connected with the charge collection terminal (drain or collector) of the low voltage transistor. Generally the power transistor has a Breakdown voltage that can exceed 1 kV and it must be able to commutate at high frequencies (at about 200 khz). The low voltage transistor has a Breakdown voltage lower than 60V and it has fast commutation features that assure the use of the emitter switching device at high frequencies.

Figure 1:
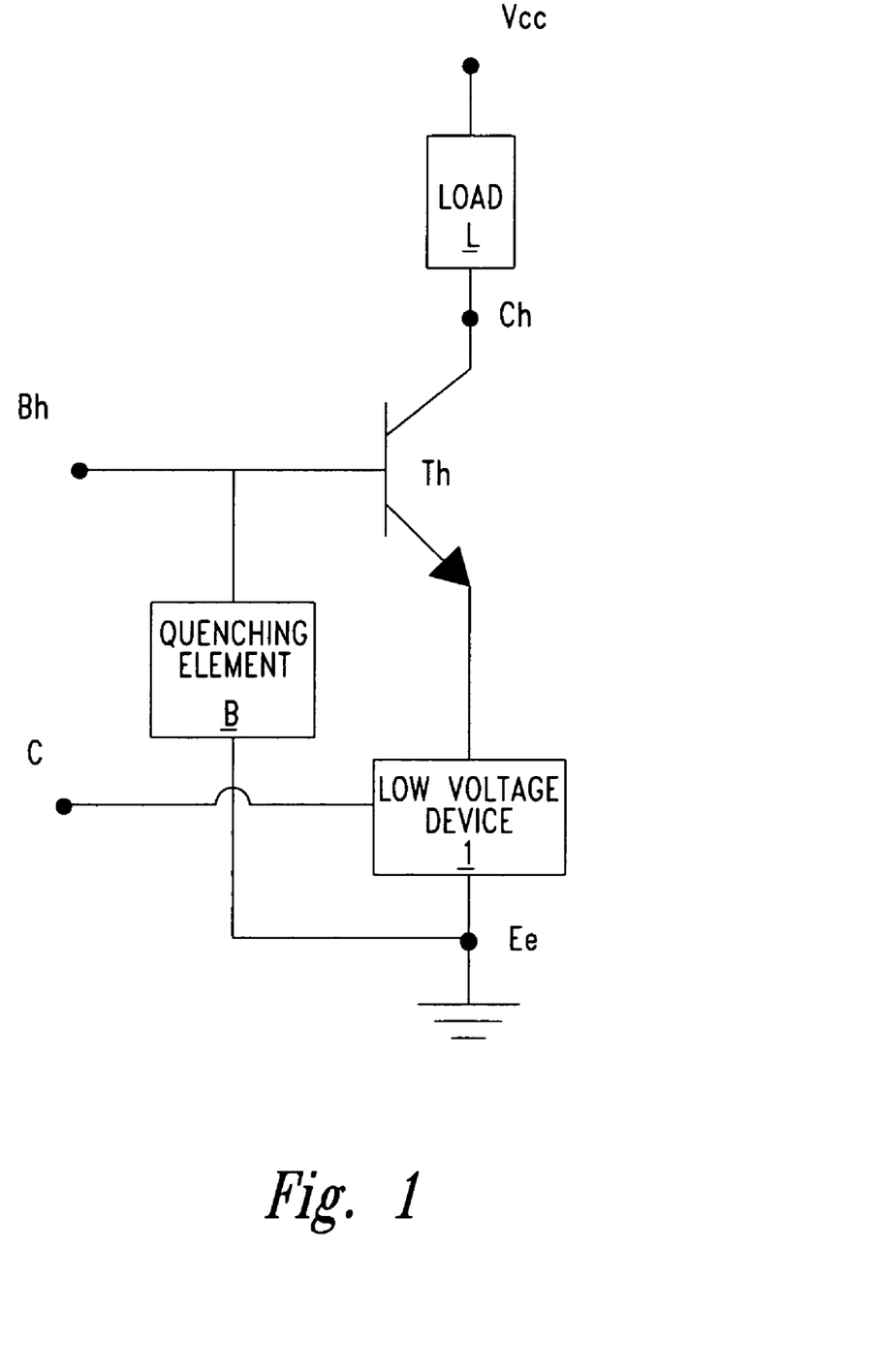
FIG. 1 is a circuit scheme of a device in emitter switching configuration according to prior art.

An example of a device in emitter-switching configuration is shown in FIG. 1. Such a device comprises a high voltage bipolar transistor Th and a MOS or bipolar low voltage device, indicated schematically by a block 1. The emitter terminal of the transistor Th is connected with the charge collection terminal (drain or collector) of the low voltage transistor 1. The base terminal Bh and the terminal C (base terminal or gate terminal of the transistor 1) constitute the control terminals of the device, which allow the connection between two circuit parts connected with the terminal Ch (collector terminal of the transistor Th) and Ee (emitter or source terminal of the transistor 1) which can be opened and closed alternately. Generally the terminal Ee is connected with ground, the terminal Ch is connected with a first terminal of a load L the second terminal of which is connected with a supply voltage Vcc. The device comprises a quenching element B constituted, for example, by a Zener diode or by a series of diodes which is connected between the terminals Bh and Ee.

During the turning on of the device, the quenching time of the transistor Th is greater than the quenching time of the transistor 1 because of the large accumulation of charges in the base of the transistor Th. After the transistor 1 is quenched, bringing the emitter current of the transistor Th to zero, a current flows from the collector of the transistor Th through its base and this current is discharged to ground through the quenching element B. Once all the charge residuals in the base of the transistor Th have been eliminated, its collector current, and hence the current in the load L, is brought to zero.

In known devices in emitter-switching configuration, the quenching element is formed, for example, by discrete components suitably connected with the two transistors; this solution increases the production cost and the size of the device.

In the case wherein both the high voltage transistor and the low voltage transistor are integrated in the same semiconductor chip, the quenching element is normally formed within an insulated well of the region wherein the control circuits are allocated.

A different solution is disclosed in U.S. Pat. No. 6,127,723 where an integrated device in emitter-switching configuration is disclosed comprising a high voltage bipolar transistor and a low voltage transistor and wherein the quenching element, a Zener diode, is formed in the base region or in the emitter region of the high voltage bipolar transistor. In this way the integrated device occupies a limited space in the semiconductor chip and a low resistance in series with the quenching element is assured so that the power dissipation at the quenching stage is reduced.

However this solution presents the disadvantage of reducing the whole area of the high voltage bipolar transistor and of the low voltage transistor in order to form the quenching element. In the case wherein the Zener diode is formed in the emitter region of the high voltage transistor, besides the reduction of the whole area of the low voltage transistor a reduction of the efficiency of the high voltage transistor in the zone underlying the Zener diode is achieved.

BRIEF SUMMARY OF THE INVENTION

The present invention provides an integrated device in emitter-switching configuration which shows a novel quenching element.

According to an embodiment of the present invention, an integrated device in emitter switching configuration is provided, said device being integrated in a chip of semiconductor material of a first conductivity type, said chip having a first surface and a second surface opposite to each other, said device comprising a first transistor having a base region, an emitter region and a collector region, a second transistor having a not drivable terminal for collecting charges which is connected with the emitter terminal of the first transistor, a quenching element of the first transistor which discharges current therefrom when said second transistor is turned off, said quenching element being coupled with the base terminal of the first transistor and with the other not drivable terminal of the second transistor, said quenching element comprising at least one Zener diode made in polysilicon, said at least one polysilicon Zener diode being formed on the second surface of said chip and comprising a polysilicon layer having at least one zone of the first conductivity type and at least one zone of a second conductivity type in order to form at least one P-N junction.

According to another embodiment of the present invention a process for manufacturing an integrated device in emitter-switching configuration is provided.

Thanks to the present invention it is possible to provide an integrated device in emitter-switching configuration which occupies a smaller space than the known devices and is particularly usable in the case wherein the collector terminal of the high voltage transistor assumes negative voltage values.

BRIEF DESCRIPTION OF THE SEVERAL VIEWS OF THE DRAWING(S)

The features and the advantages of the present invention will be made evident by the following detailed description of its particular embodiments, illustrated as not limiting examples in the annexed drawings, wherein.

DETAILED DESCRIPTION OF THE INVENTION

Figure 2:
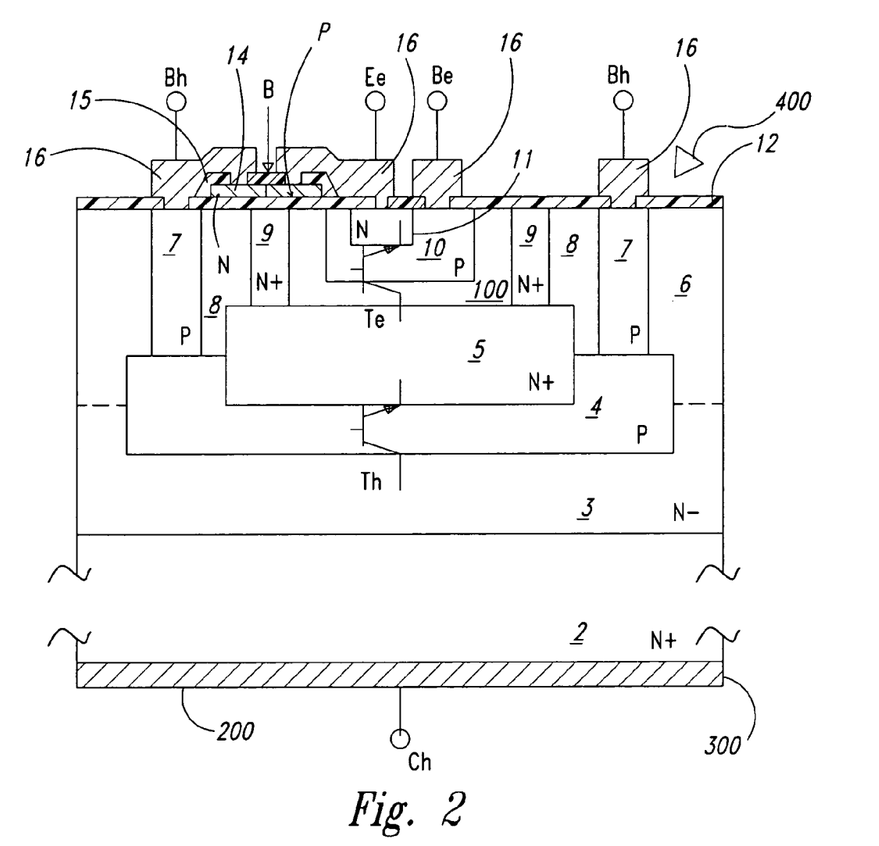
FIG. 2 is a schematic cross-section of an integrated device in emitter-switching configuration according to a first embodiment of the invention.

With reference to FIG. 2 an integrated device in emitter-switching configuration is shown which is formed in a semiconductor substrate 2 having N-type dopant of a high concentration according to a first embodiment of the invention. The integrated device is formed, for example, by means of the VIPower process (VIPower is a trademark of the SGS-THOMSON MICROELECTRONICS S.r.l.) described in the U.S. patent application Ser. No. 4,965,215 in the name of SGS-THOMSON MICROELECTRONICS S.r.l., and incorporated herein by reference, wherein the high voltage transistors have a totally vertical conduction structure, wherein the different P-N junctions are buried and the collector electrode is formed on the bottom surface of the chip.

The semiconductor material chip wherein the integrated device is formed comprises on the substrate 2 a first epitaxial layer 3 with N-type dopant of a low concentration, which is formed on the substrate by means of an epitaxial growth. A P-type silicon region 4 is formed on the top surface of the epitaxial layer 3 by means of an ionic implant and successive diffusion; a region 5 with N-type dopant of a high concentration is formed on the P-type region 4. A second epitaxial layer 6 that has a dopant concentration higher than the first epitaxial layer is formed on the first layer by epitaxial growth. The high temperature of this process step allows the diffusion of the P and N type impurities inside the epitaxial layers 3 and 6.

P-type contact regions 7 extending through the whole epitaxial layer 6 and which are connected with the region 4, are then formed in the layer 6 by means of known technologies of masking, implant and diffusion so as to define a portion 8 of the epitaxial layer 6. N-type contact regions 9 with high dopant concentration which are connected with the region 5 are formed by similar technologies. At least one P-type region 10 is formed by means of similar implant and diffusion technologies (or alternatively by means of a deposition process) inside a portion 100 of the layer 6 which is delimited by the regions 9. An N-type region 11 is then implanted and diffused in the region 10.

Figure 3:
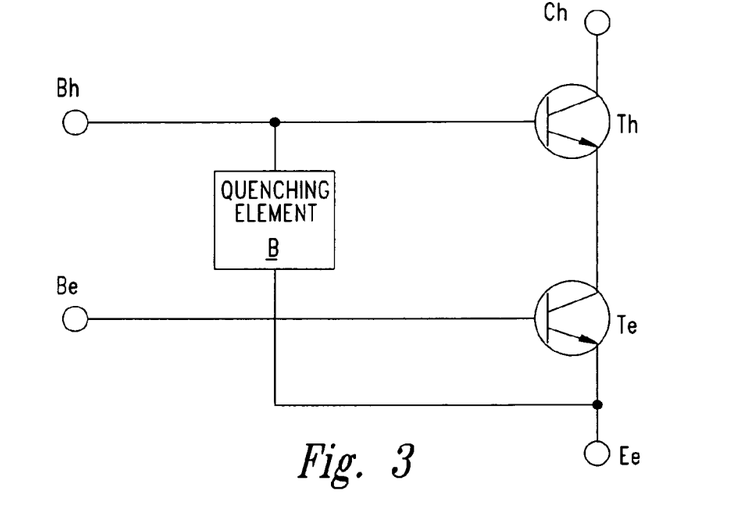
FIG. 3 is a circuit scheme of the device in FIG. 2.

In such way the transistors Th and Te have been formed which are present in the circuit configuration in FIG. 3: in fact the regions 5, 4, 3 represent respectively the emitter, base and collector regions of the bipolar transistor Th and the regions 11, 10 and 100 represent respectively the emitter, base and collector regions of the bipolar transistor Te.

On the top surface 400 of the chip an insulated layer 12, typically silicon oxide, is deposited by using an appropriate masking. Successively, by means an appropriate masking, a polysilicon layer 14 on a silicon oxide region 13 placed over the region 9 and an adjacent portion of the layer 6 which is allocated between said region 9 and the region 7 on the left part of the chip as showing FIG. 2.

Figure 6A:
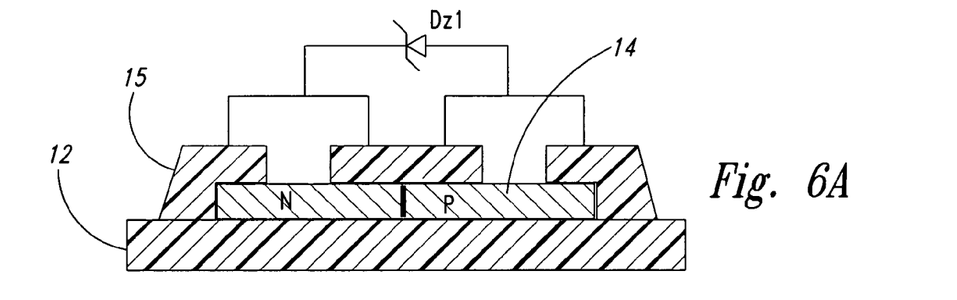
FIGS. 6A–6D show different quenching structures that can be used in the formation of the devices in FIGS. 2 and 4.

Always using appropriate masking a doping of the whole polysilicon layer 14 with a P-type dopant (for example boron) and a successive doping with a N-type dopant (for example phosphorus) above some parts of the layers 14 in order to form one or more P-N junctions occurs. Alternatively the whole polysilicon layer 14 can be doped with an N type dopant (for example phosphorus) and successively with a P-type dopant only above some parts of the layer 14 in order to form one or more P-N junctions. Successively, by using an appropriate masking, a deposition of oxide 15 over the polysilicon layer 14 and an attack of the oxide layers 12 and 15 for forming the zones wherein the contacts of the transistors Th and Te and of the P-N junctions by means of a successive deposition of a metal layer 16 are formed occur. The one or more P-N junctions represent the quenching element B of the circuit scheme of FIG. 3. If, for example, a single P-N junction has been formed as shown in FIG. 2 and in FIG. 6a, that is a single Zener diode, one of the two terminals Bh which are present in FIG. 2 contacts both the region 7 and the N part of the P-N junction while the P part is contacted by the terminal Ee that contacts even the region 11. The terminal Be contacts the region 10. A collector electrode Ch is formed by a metal layer 200 on the below surface 300 of the substrate 2.

Figure 6B:
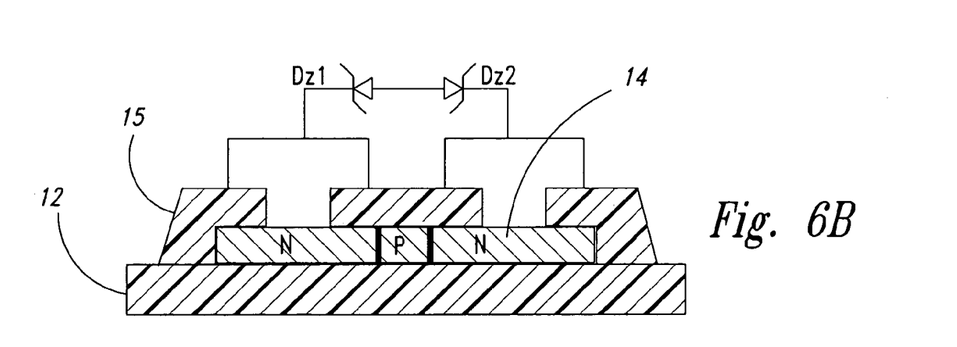
Figure 6C:
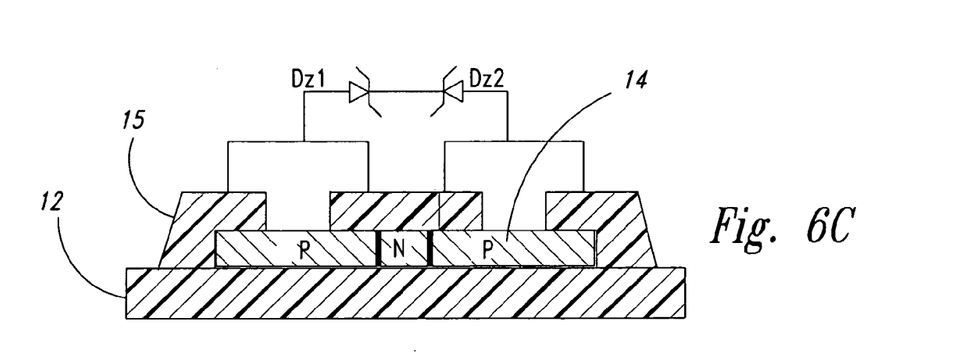
Figure 6D:
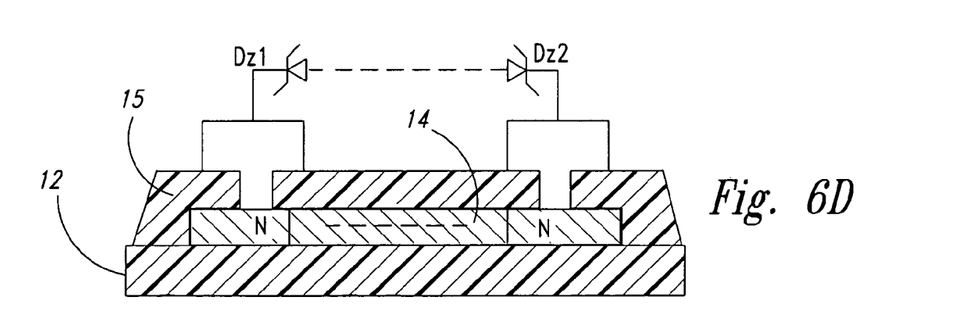

Instead of a single P-N and therefore of a single Zener diode Dz1 it is possible to form on the polysilicon layer 14 two P-N junctions in order to form two Zener diodes Dz1 and Dz2 in back to back connection, that is with anodes and cathodes which are united together as shown respectively in FIGS. 6b and 6c, or different P-N junctions in order to form different couples of Zener diodes Dz1 ... Dzn in back to back connection, as shown in FIG. 6d.

In the top view the transistor Th presents typically a geometric shape called "interdigitated" wherein the emitter region extends as a comb having elongated portions (fingers) inside the base region. The structures of the polysilicon diodes which have been described are fit to be distributed along all the perimeter of the fingers of the transistor Th in order to obtain an optimal junction perimeter, even occupying the same space of an emitter-switching device without an integrated quenching element.

Figure 4:
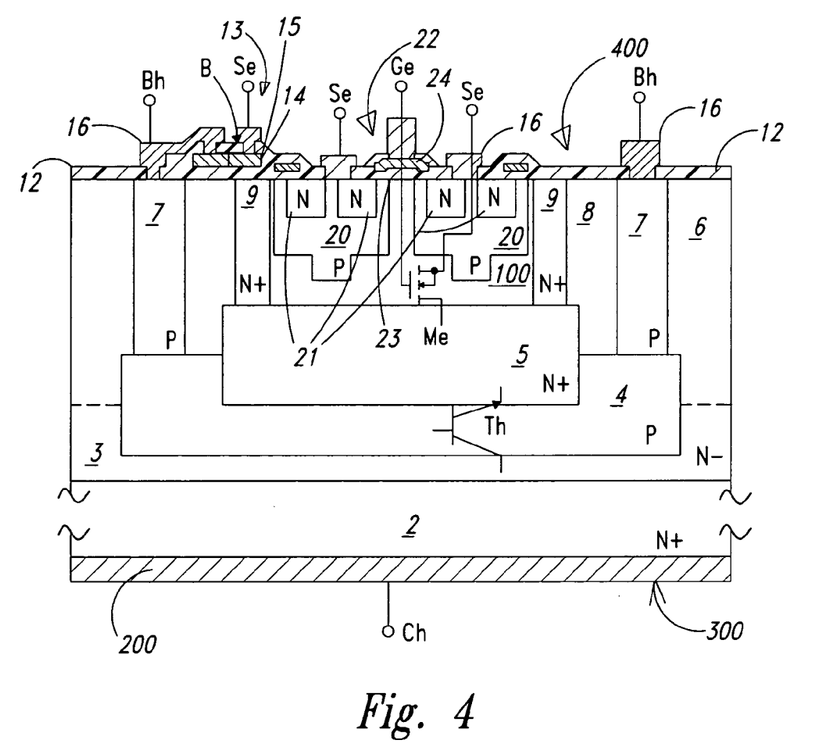
FIG. 4 is a schematic cross-section of an integrated device in emitter-switching configuration according to a second embodiment of the invention.

In FIG. 4 a device in emitter switching configuration which is formed in the semiconductor substrate 2 with high N-type dopant concentration according to a second embodiment of the invention is shown. The integrated device of such second embodiment of the invention differs from the device of the first embodiment because of the presence of a MOS transistor as low voltage transistor. After the formation of the epitaxial layer 3 on the substrate 2 and the successive formation of the region 4, of the second epitaxial layer 6, of the regions 7, of the region 5 and of the regions 9, the combination of which allows the formation of the transistor Th, a formation of P-type regions 20 in the epitaxial layer portion comprised between the regions 9 occurs. In each region 20 couples of N-type regions 21 are formed and a formation of a gate structure 22 by means of an oxide layer 23 and a overlying polysilicon layer 24 occurs on the top surface of the chip, over the portion of epitaxial layer 6 which is comprised between the region 20.

Figure 5:
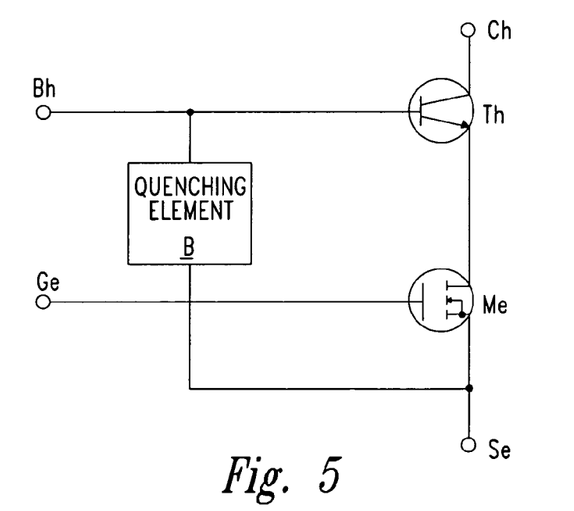
FIG. 5 is a circuit scheme of the device in FIG. 4.

The gate structure 22 represents the gate of the transistor Me in FIG. 5 while the regions 20 represent the body region of the transistor Me and the regions 21 and 5 represent respectively the source and drain regions of the MOS transistor Me. The gate and source terminals Ge and Se are formed by means of a deposition of a metal layer 16 on bores formed by attacking the oxide layer 12 placed on the top surface of the chip.

Two polysilicon Zener diodes in back to back connection are formed over the top surface 400 of the chip after a deposition of a polysilicon layer 14 over a silicon oxide region 13 placed over a region 9 and an adjacent portion of the layer 6 which is allocated between said region 9 and a region 7 on the left part of the chip as showing the FIG. 4. Such Zener diodes act as a quenching element B of the transistor Th.

Alternatively, instead of the two Zener diodes in back to back configuration, configurations comprising a single Zener diode or more than two Zener diodes as shown in FIGS. 6a–6d can be utilized for the integrated device in FIG. 4.

Figure 12:
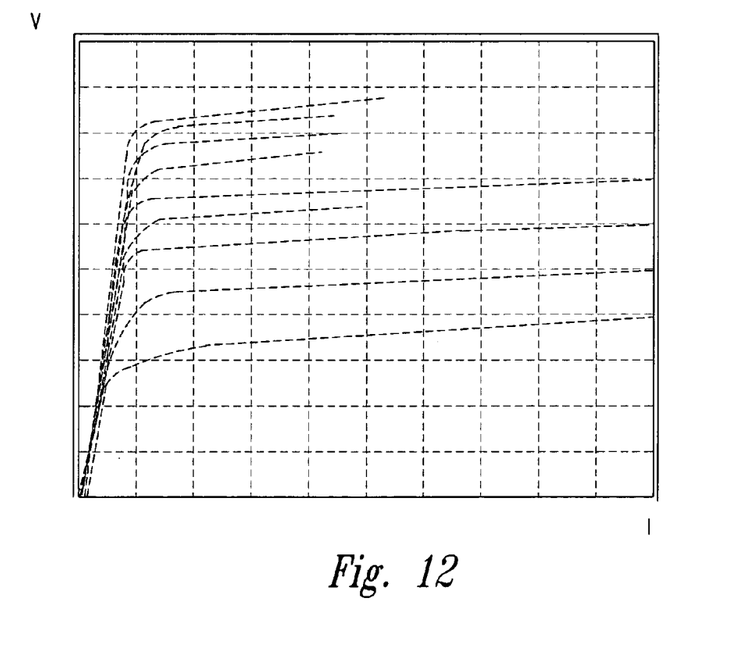
FIG. 12 is a diagram of the output features of the device in FIG. 5 by imposing a voltage Vgs=10V.
Figure 13:
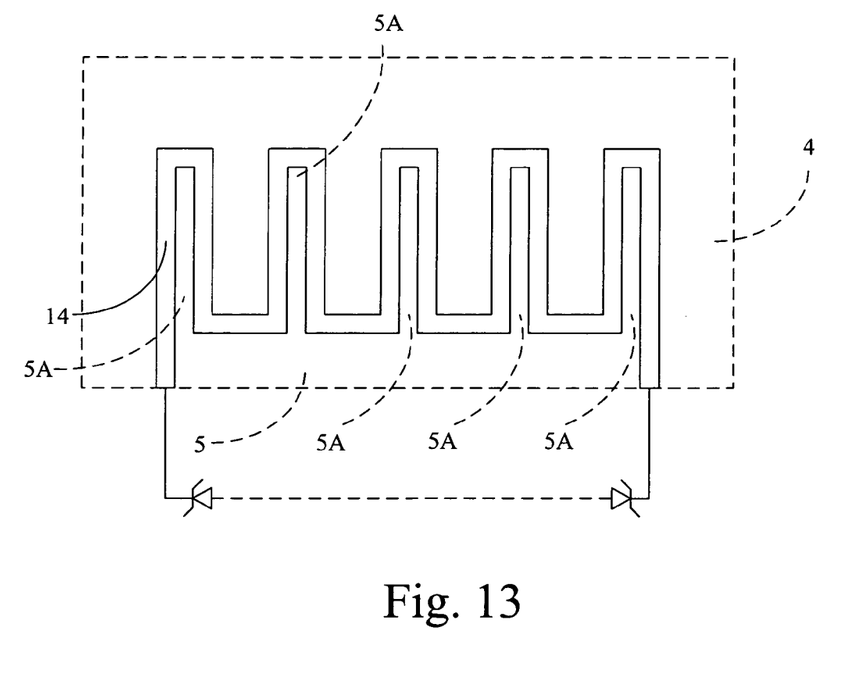

In FIG. 12 the output features measured for an emitter switching device as in FIGS. 4, 5 by imposing a control voltage Vgs=10V are shown.

Figure 7:
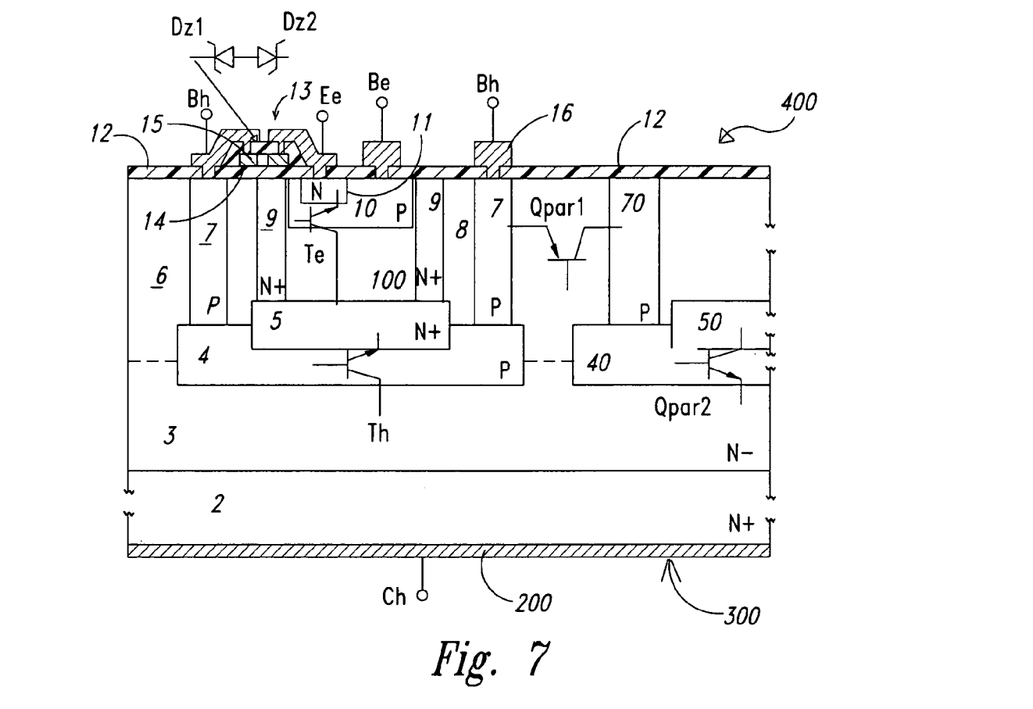
FIG. 7 is a schematic cross-section of an integrated device in emitter-switching configuration according to a third embodiment of the invention.
Figure 8:
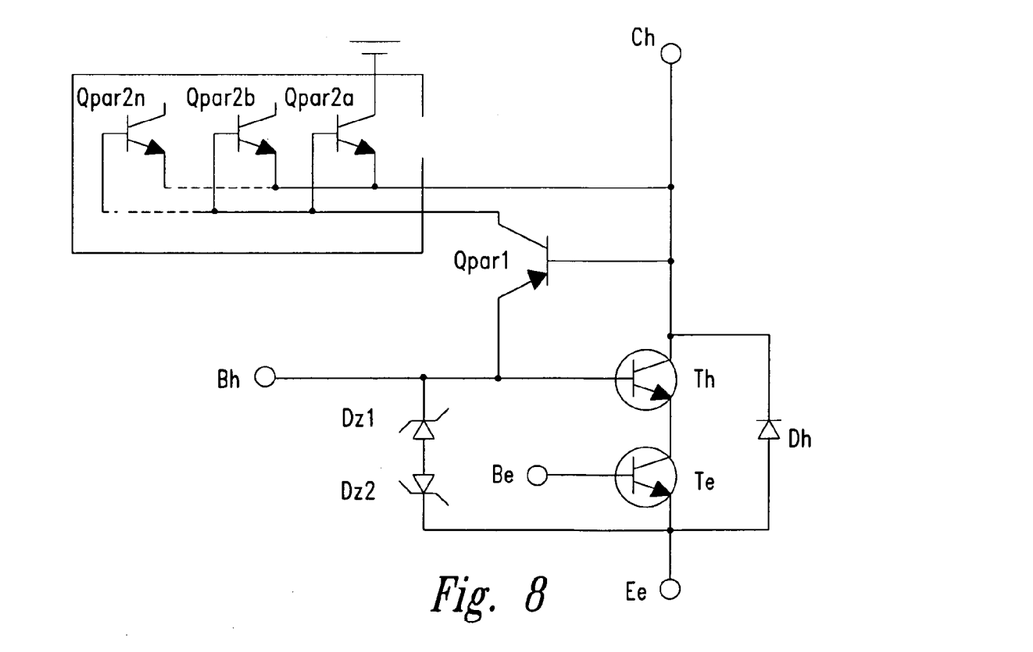
FIG. 8 is a circuit scheme of the device in FIG. 7.

An emitter switching device formed in a semiconductor substrate 2 with high N-type dopant concentration according to a third embodiment of the invention is shown in FIGS. 7, 8. The integrated device shown in FIGS. 7, 8 is similar to the device shown in FIGS. 2, 3 but it differs for the use of two polysilicon Zener diodes Dz1, Dz2 in back to back connection as a quenching element, to which a diode Dh, which can be integrated in the same device or placed outside the chip and which is connected between the terminals Ch (collector terminal of the transistor Th) and Be (emitter terminal of the transistor Te), is added and for the addition of control circuits not shown in Figures. Such control circuits integrated in the same chip are normally formed inside a P-type region 40 aligned to the region 4. The formation of such control circuits is accompanied by the presence of parasitic transistors formed, as showing FIG. 8, for example, by a pnp transistor Qpar1 having the emitter terminal connected with the terminal Bh and the collector terminal connected with the P-type region 40 wherein are formed the control circuits, and which is connected with the base terminals of a series of bipolar transistors Qpar2a . . . Qpar2n the emitter terminals of which are connected with different supply voltages or coincide with the collector terminals of the npn transistors of the control circuits.

The integrated device in FIG. 7 presents with respect to the device in FIG. 2 other regions 40, 50, 70 which are similar to the region 4, 5, 7 and which are aligned to them and are formed in the right part of the chip as showing FIG. 8. In such way the emitter and collector regions of the bipolar transistor Qpar1 are formed respectively by the regions 7 and 70 while the base region is formed by the portion of the layer 6 which is comprised between the layers 7 and 70. The emitter and base regions of the transistors Qpar2a . . . Qpar2n are given respectively by the layers 3 and the region 40 while the collector regions of the aforementioned transistors are given by different N-type regions similar to the region 50 (in FIG. 7 only the transistor Qpar2a is shown).

The integrated device of FIGS. 7 and 8 is utilized above all in the case wherein the terminal Ch assumes negative voltage values. In this case the high voltage diode Dh goes in conduction when the voltage at the terminal Ch becomes negative with respect to the terminal Ee, put generally at ground. For a correct management of the control circuits the parasitic transistors Qpar2a . . . Qpar2n must never be turned on both in direct conduction and in inverse conduction, that is with the substrate coinciding with the collector or with the emitter of the same parasitic transistor. The turning on of the transistors Qpar2a . . . Qpar2n occurs if the transistor Qpar1 goes in saturation region that is if the voltage value of the terminal Ch assumes a value equal to −[V1+V2+Vbe(Qpar1)] where V1 and V2 are the voltages at the terminals of the Zener diodes Dz1, Dz2 and Vbe(Qpar1) is the base-emitter voltage of the transistor Qpar1.

It is obvious that, in these bias conditions (with the terminal Ee positive with respect to the terminal Bh), the diode Dz1 is biased in the direct region of the diagram (V1=Vd1 0.6V), while the diode Dz2 is biased in the inverse region (V2=Vz2).

With respect to the electric configuration wherein the quenching element B is a simple Zener diode, as in the case of the previous indicated known art U.S. Pat. No. 6,127,723, the above described configuration including the polysilicon diodes in back to back connection as a quenching elements, offers a notable advantage for the immunity against the turning on of the parasitic transistors Qpar2a . . . Qpar2n. In fact in the known art, the turning on of said parasitic transistors Qpar2a . . . Qpar2n would be obtained if the voltage of the terminal Ch assumes a value equal to −[Vd(B)+Vbe(Qpar1)], where Vd(B) is the direct bias voltage of the single Zener diode used as a quenching element.

Figure 9:
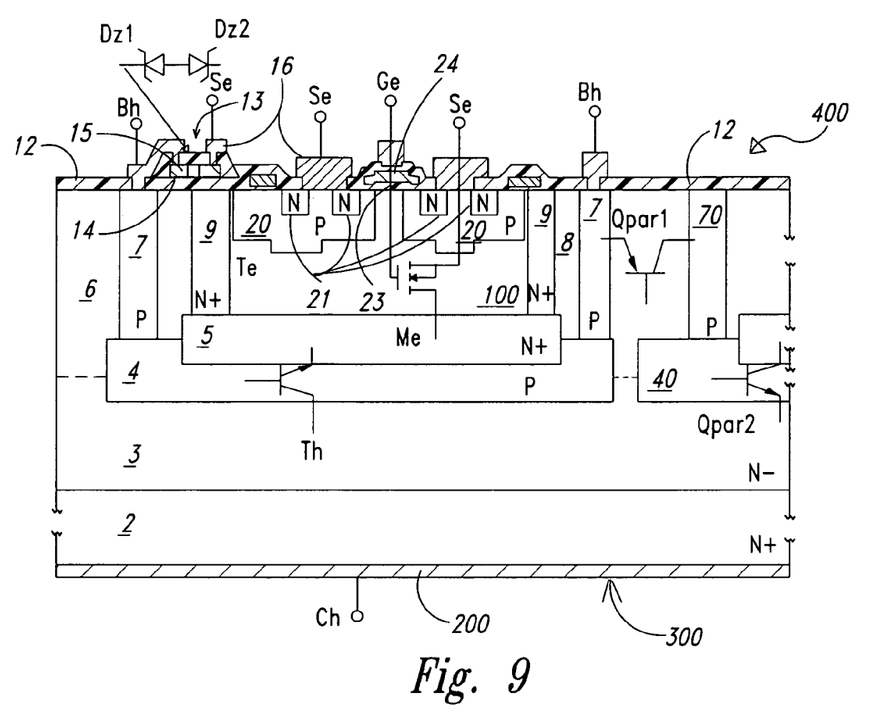
FIG. 9 is a schematic cross-section of an integrated device in emitter-switching configuration according to a fourth embodiment of the invention.
Figure 10:
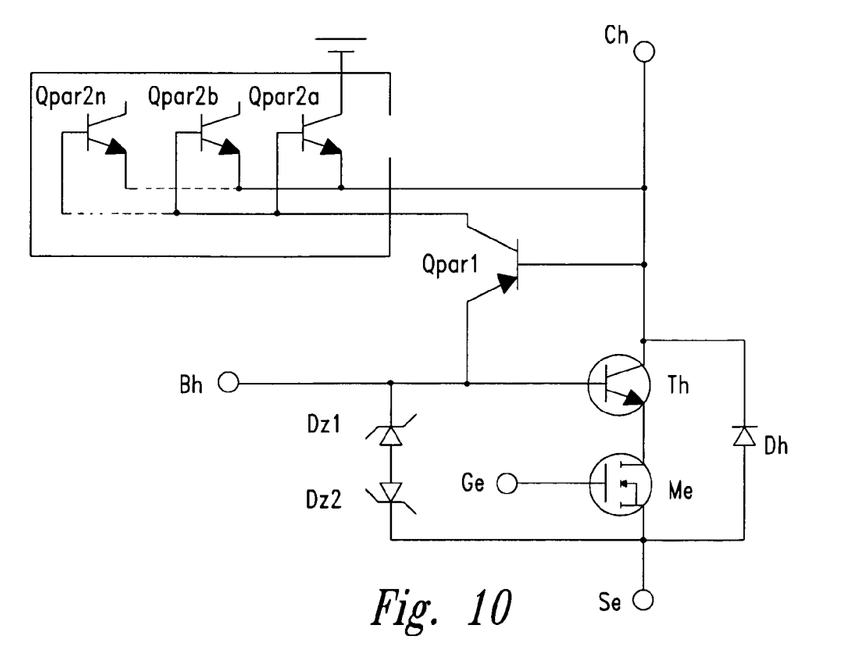
FIG. 10 is a circuit scheme of the device in FIG. 9.

An emitter switching device formed in a semiconductor substrate 2 with high N-type dopant concentration according to a fourth embodiment of the invention is shown in FIGS. 9, 10. The integrated device shown in FIGS. 9, 10 is similar to the device shown in FIGS. 7, 8 with only the difference of using the MOS transistor Me already shown in FIGS. 5, 6 and previous described as low voltage transistor. All the considerations made for the device according to the third embodiment of the invention are valid for the device shown in FIGS. 9 and 10.

Figure 11A:
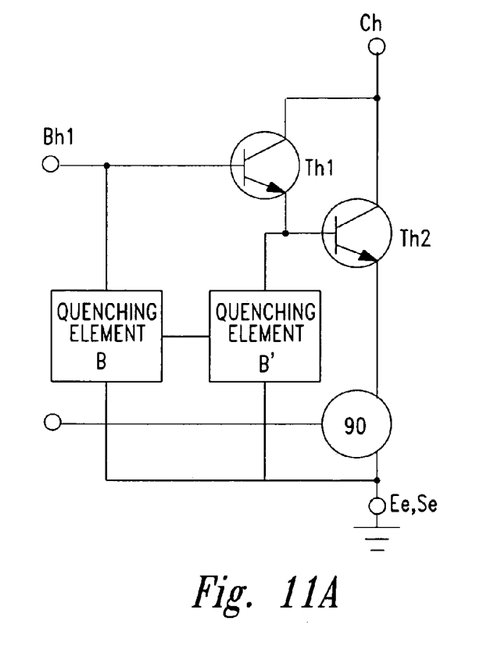
FIGS. 11A and 11B show circuit schemes of an integrated device in emitter-switching configuration according to a fifth embodiment of the invention.
Figure 11B:
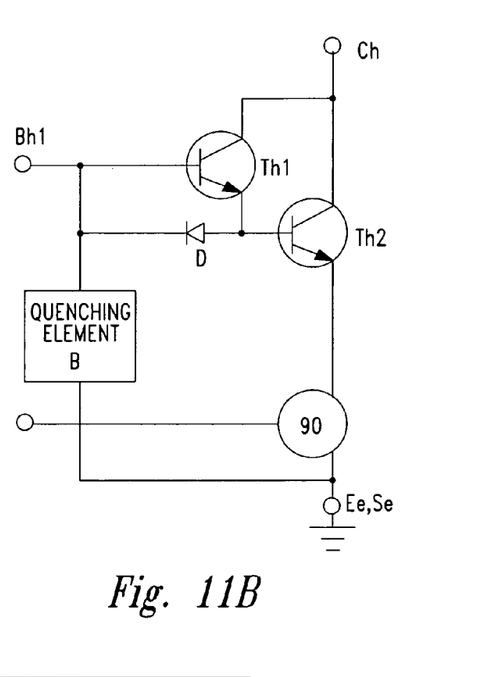

A device in emitter-switching configuration according to a fifth embodiment of the invention is shown in FIGS. 11a and 11b. The integrated device shown in FIGS. 11a and 11b differs from the other embodiments for the presence of a power transistor in a Darlington configuration, that is it is formed by two high voltage bipolar transistors Th1 and Th2 which have the collector terminals in common and the emitter terminal of the transistor Th1 connected with the base terminal of the transistor Th2. The latter can be connected with the anode of a diode D the cathode of which is connected with the base terminal Bh1 of the transistor Th1 as in FIG. 11b or it can be connected with a quenching element B' connected with a not drivable terminal of the low voltage transistor (the bipolar transistor Te or the MOS transistor Me) indicated generally by the block 90, as in FIG. 11a. All the considerations made for the devices according to the previous embodiments are valid for the device shown in FIGS. 11a and 11b.

What is claimed is:

1. An Integrated device in emitter switching configuration, said device being integrated in a chip of semiconductor material of a first conductivity type, said chip having a first surface and a second surface opposite to each other, said device comprising:

a first transistor having a base region, an emitter region and a collector region;

a second transistor having a not drivable terminal for collecting charges, which is connected with the emitter terminal of the first transistor; and a quenching element that discharges current from the first transistor when said second transistor is turned off, said quenching element being coupled with the base region of the first transistor and with the not drivable terminal of the second transistor, said quenching element having at least one Zener diode made in polysilicon, said at least one polysilicon Zener diode being formed on the second surface of said chip and comprising a polysilicon layer having at least one zone of the first conductivity type and at least one zone of a second conductivity type in order to form at least one P-N junction, wherein the emitter region of the first transistor extends as a comb having elongated portions inside the base region and the polysilicon region includes a plurality of zener diodes distributed along a perimeter of the elongated portions.

2. The Integrated device according to claim 1, wherein said chip comprises a first region of the second conductivity type which extends from the second surface into the chip and a second region of the first conductivity type which extends from the second surface into the first region, and the first region, the second region and a portion of the chip comprised between the first region and the first surface forming respectively the base region, the emitter region and the collector region of the first transistor.

3. Integrated device according to claim 2, wherein said first transistor and said second transistor are bipolar transistors and said chip comprises a third region of the second conductivity type which extends from the second surface into the second region and a fourth region of the first conductivity type which extends from the second surface into the third region, each of the second region, of the third region and of the fourth region forming respectively the collector region, the base region and the emitter region of the second transistor.

4. Integrated device according to claim 2, comprising a bipolar third transistor connected with the first transistor in a Darlington configuration wherein the emitter terminal of the first transistor is connected with a base terminal of the third transistor and the collector terminal of the first transistor is connected with a collector terminal of the third transistor.

5. Integrated device according to claim 2, wherein said second transistor is a MOS transistor and said chip comprises a couple of third regions of the second conductivity type which extend from the second surface into the second region and a couple of fourth regions of the first conductivity type which extend from the second surface into each one of third regions, each of the second region, of the third regions and of the fourth regions forming respectively the drain region, the body region and the source region of the second transistor.

6. Integrated device according to claim 1, wherein said first conductivity type of the semiconductor material is of N-type and said second conductivity type of semiconductor material is of P-type.

7. Integrated device according to claim 1, wherein said first conductivity type of the semiconductor material is of P-type and said second conductivity type of semiconductor material is of N-type.

8. Integrated device according to claim 1, wherein said at least one polysilicon Zener diode comprises a polysilicon Zener diode the cathode of which is connected with the base terminal of the first transistor and the anode of which is connected with said other not drivable terminal of the second transistor and said polysilicon layer comprises only one P-N junction.

9. Integrated device according to claim 1, wherein said at least one polysilicon Zener diode comprises first and second polysilicon Zener diodes in back to back connection wherein the anode of the first Zener diode is connected with the anode of the second Zener diode and the cathode of the first Zener diode is connected with the base terminal of the first transistor and the cathode of the second Zener diode is connected with said other not drivable terminal of the second transistor and said polysilicon layer comprises two P-N junctions.

10. Integrated device according to claim 1, wherein said at least one polysilicon Zener diode comprises first and second polysilicon Zener diodes in back to back connection wherein the cathode of the first Zener diode is connected with the cathode of the second Zener diode and the anode of the first Zener diode is connected with the base terminal of the first transistor and the anode of the second Zener diode is connected with said other not drivable terminal of the second transistor and said polysilicon layer comprises two P-N junctions.

11. Integrated device according to claim 1, wherein said at least one polysilicon Zener diode comprises a series of couples of polysilicon Zener diodes in back to back connection wherein the cathode of the one Zener diode of one couple is connected with the cathode of the other Zener diode of the same couple and so on and the anode of the first Zener diode is connected with the base terminal of the first transistor and the anode of the last Zener diode is connected with said other not drivable terminal of the second transistor and said polysilicon layer comprises a series of P-N junctions.

12. Integrated device according to claim 1, wherein said at least one polysilicon Zener diode comprises a series of couples of polysilicon Zener diodes in back to back connection wherein the anode of the one Zener diode of one couple is connected with the anode of the other Zener diode of the same couple and so on and the cathode of the first Zener diode is connected with the base terminal of the first transistor and the cathode of the last Zener diode is connected with said other not drivable terminal of the second transistor and said polysilicon layer comprises a series of P-N junctions.

13. Integrated device according to claim 1, wherein said at least one polysilicon Zener diode is formed on the second surface of the chip in a zone over an insulated layer.

14. Integrated device according to claim 1, comprising a diode the cathode of which is connected with the collector terminal of the first transistor and the anode of which is connected with said other not drivable terminal of the second transistor, said diode conducing when the voltage value at the collector terminal becomes lower than the voltage value at the other not drivable terminal of the second transistor.

15. A device, comprising:
a semiconductor substrate of a first type of conductivity;
a first region having a second type of conductivity formed in the semiconductor substrate;
a second region having the first type of conductivity formed over and in contact with the first region, the first and second regions and a portion of the substrate underlying the first region forming base, emitter and collector, respectively, of a first transistor;
a second transistor formed in the substrate and including a third region having the first type of conductivity, formed over and in contact with the second region;

the second transistor also including a fourth region having the second type of conductivity, formed in the third region;

an insulating layer selectively formed on an upper surface of the substrate;

a polysilicon layer selectively formed on the insulating layer; and a zener diode formed in the polysilicon layer and including first and second junction regions having first and second types of conductivity, respectively, the diode being configured to discharge current from the first region when the second transistor is turned off, wherein the second region of the first transistor extends as a comb having elongated portions inside the first region of the first transistor and the zener diode is one of a plurality of zener diodes formed in the polysilicon layer and distributed along a perimeter of the elongated portions.

16. The device of claim 15 wherein the second transistor is a bipolar transistor and further includes a fifth region having the first type of conductivity and formed in the fourth region, the third, fourth and fifth regions comprising collector, base and emitter, respectively, of the second transistor.

17. The device of claim 15 wherein the second transistor is a MOS transistor and further includes:
a fifth region having the second type of conductivity, formed in the third region and separated from the fourth region by a portion of the third region;
sixth and seventh regions having the first type of conductivity and formed in the fourth and fifth regions, respectively; and
a polysilicon region formed on the insulating layer, apart from the polysilicon layer and over the portion of the third region, the polysilicon region, the sixth and seventh regions, and the fourth region comprising gate, source and drain, respectively, of the MOS transistor.

18. The device of claim 15 wherein the zener diode is one of a plurality of zener diodes formed in the polysilicon layer, the plurality of diodes connected in series, and alternating in polarities.

19. The integrated device of claim 1 wherein said quenching element is on a first side of the second surface, and wherein substantially all semiconducting regions are on a second side of the second surface.

20. The device of claim 15 further comprising:
the first, second, third, and fourth regions formed on a first side of the insulating layer; and
the polysilicon layer selectively formed on a second side of the insulating layer.

21. An integrated device integrated in a chip of semiconductor material of a first conductivity type, the chip having a first surface and a second surface opposite to each other, the device comprising:
a first transistor having a control region and first and second conduction regions;
a second transistor having a control region and first and second conduction regions, the first conduction region of the second transistor being connected to the second conduction region of the first transistor; and
quenching means for discharging current from the first transistor when the second transistor is turned off, the quenching means being connected between the control terminal of the first transistor and the second conduction region of the second transistor, being positioned in a polycrystalline semiconductor layer formed on the second surface of the chip, and including a first zone of the first conductivity type and a second zone of a second conductivity type in order to form a first P-N junction, wherein the second conduction region of the first transistor extends as a comb having elongated portions inside the control region of the first transistor and the polycrystalline semiconductor layer includes a plurality of zener diodes distributed along a perimeter of the elongated portions.

22. The integrated device of claim 21, wherein the control region of the second transistor includes a first region of the second conductivity type that extends from the second surface into the chip, the second conduction region of the second transistor includes a second region of the first conductivity type the extends from the second surface into the first region, and the first conduction region of the second transistor includes a third region of the first conductivity type positioned between the first region and the first surface.

23. The integrated device of claim 22, wherein the first transistor and the second transistor are bipolar transistors, the second conduction region of the first transistor includes the third region, the first conduction terminal of the first transistor includes a portion of the chip between the third region and the first surface, and the control region of the first transistor includes a fourth region positioned between the third region and the portion of the chip between the third region and the first surface.

24. The integrated device of claim 21 wherein the second conduction region of the first transistor includes a first buried region of the first conductivity type, the control region of the first transistor includes a second buried region of the second conductivity type, and the first conduction region includes a portion of the chip between the second buried region and the first surface.

25. The integrated device of claim 24 wherein the second conduction region of the second transistor includes a region of the first conductivity type extending from the second surface into the chip, the device further comprising:
a sinker region that extends from the second surface of the chip to the second buried region;
a first conductive connector positioned on the second surface and connecting the sinker region to the first zone; and
a second conductive connector positioned on the second surface and connecting the second conduction region of the second transistor to the second zone.

26. The integrated device of claim 21 wherein the first transistor is a bipolar transistor and the second transistor is a field-effect transistor.

27. The integrated device of claim 21, further comprising a bipolar third transistor connected with the first transistor in a Darlington configuration wherein an emitter terminal of the first transistor is connected with a base terminal of the third transistor and a collector terminal of the first transistor is connected with a collector terminal of the third transistor.

28. The integrated device of claim 27 wherein the quenching means includes first and second zener diodes connected respectively between the second conduction terminal of the second transistor and base terminals of the first and third transistors.

29. The integrated device of claim 21 wherein the quenching means includes first and second zener diodes in back to back connection.

30. The integrated device of claim 21, further comprising an insulating layer positioned between the polycrystalline semiconductor layer and the second surface of the chip.

* * * * *